US011522337B2

(12) United States Patent
Kondo (10) Patent No.: US 11,522,337 B2
(45) Date of Patent: Dec. 6, 2022

(54) DRIVER CIRCUIT AND PROCESSING DEVICE

(71) Applicant: NICHIA CORPORATION, Anan (JP)

(72) Inventor: Hideki Kondo, Yokohama (JP)

(73) Assignee: NICHIA CORPORATION, Anan (JP)

( * ) Notice: Subject to any disclaimer, the term of this patent is extended or adjusted under 35 U.S.C. 154(b) by 893 days.

(21) Appl. No.: 16/391,182

(22) Filed: Apr. 22, 2019

(65) Prior Publication Data
US 2019/0326727 A1   Oct. 24, 2019

(30) Foreign Application Priority Data

Apr. 23, 2018   (JP) .............................. JP2018-082447

(51) Int. Cl.
*G05F 1/44*   (2006.01)
*H01S 5/042*   (2006.01)
(Continued)

(52) U.S. Cl.
CPC .......... *H01S 5/042* (2013.01); *B23K 26/0626* (2013.01); *B23K 26/38* (2013.01); *G05F 1/44* (2013.01); *H03F 3/45475* (2013.01); *H03F 2200/129* (2013.01); *H03F 2200/165* (2013.01); *H03F 2200/171* (2013.01); *H03F 2203/45116* (2013.01)

(58) Field of Classification Search
CPC ...... H01S 5/042; H01S 5/0428; H01S 5/4018; B23K 26/0626; B23K 26/38; H03F 3/45475; H03F 2200/129; H03F 2200/165; H03F 2200/171; H03F 2203/45116; H05B 33/0803; G05F 1/44; G05F 1/40
See application file for complete search history.

(56) References Cited

U.S. PATENT DOCUMENTS 6,388,689 B1   5/2002   Toda et al.
2002/0149807 A1   10/2002   Sumi
(Continued)

FOREIGN PATENT DOCUMENTS

JP   2001-096794 A   4/2001
JP   2002-303814 A   10/2002
(Continued)

*Primary Examiner* — Jung Kim
(74) *Attorney, Agent, or Firm* — Foley & Lardner LLP (57) ABSTRACT

A driver circuit includes: a current-controlling switching element electrically connected to a light emitting element; a differential amplifier circuit including: an output terminal electrically connected to the current-controlling switching element, a first input terminal configured to receive a reference signal as a reference for radiating light with a desired intensity from the light emitting element, and a second input terminal configured to receive a detection signal corresponding to a detection result of a current flowing in the light emitting element, wherein the differential amplifier circuit is configured to control the current flowing in the light emitting element and the current-controlling switching element based on a voltage of the first input terminal and a voltage of the second input terminal; and an adjustment part configured to adjust an overshoot amount of a rising edge of the current flowing in the light emitting element.

12 Claims, 3 Drawing Sheets

(51) Int. Cl.
*H03F 3/45* (2006.01)
*B23K 26/06* (2014.01)
*B23K 26/38* (2014.01)

(56) References Cited

U.S. PATENT DOCUMENTS

| | | |
|---|---|---|
| 2009/0003395 A1 | 1/2009 | Murison et al. |
| 2014/0139603 A1 | 5/2014 | Fujita et al. |
| 2016/0181924 A1* | 6/2016 | Sugiura .................. G05F 1/565 |
| | | 323/271 |
| 2017/0373467 A1 | 12/2017 | Oozeki et al. |

FOREIGN PATENT DOCUMENTS

| | | |
|---|---|---|
| JP | 2002-307645 A | 10/2002 |
| JP | 2003-266763 A | 9/2003 |
| JP | 2010-167575 A | 8/2010 |
| JP | 2014-107461 A | 6/2014 |
| JP | 2018-006365 A | 1/2018 |
| JP | 2018-041938 A | 3/2018 |

\* cited by examiner

DRIVER CIRCUIT AND PROCESSING DEVICE

CROSS-REFERENCE TO RELATED APPLICATIONS

This application is based upon and claims priority to Japanese Patent Application No. 2018-082447, filed on Apr. 23, 2018, the entire contents of which are incorporated herein by reference.

FIELD

Embodiments described herein relate generally to a driver circuit and a processing device.

BACKGROUND

There is known a processing device for processing an object by light radiated from a light emitting element.

Examples of such a processing device include a laser exposure device for performing light exposure of a resist with laser light, and a laser machining device for machining, for example, cutting, an object with laser light.

The processing device includes a light emitting element and a driver circuit for driving the light emitting element. The driver circuit controls the intensity of light radiated from the light emitting element by controlling the current flowing in the light emitting element. In the processing device, the intensity of light radiated from the light emitting element affects the accuracy of processing the object. Thus, in such a driver circuit and a processing device thereof, it is desired to control the current flowing in the light emitting element more appropriately in order to achieve higher processing accuracy.

SUMMARY

A driver circuit according to one embodiment includes a current-controlling switching element, a differential amplifier circuit, and an adjustment part. The current-controlling switching element is electrically connected to a light emitting element. The differential amplifier circuit includes an output terminal, a first input terminal, and a second input terminal. The output terminal is electrically connected to the current-controlling switching element. The first input terminal receives a reference signal as a reference for radiating light with a desired intensity from the light emitting element. The second input terminal receives a detection signal corresponding to a detection result of a current flowing in the light emitting element. The differential amplifier circuit controls the current flowing in the light emitting element and the current-controlling switching element based on a voltage of the first input terminal and a voltage of the second input terminal. The adjustment part is capable of adjusting an overshoot amount of a rising edge of the current flowing in the light emitting element.

A processing device according to one embodiment includes a light emitting element, a driver circuit, and a control part. The driver circuit drives the light emitting element and including. The current-controlling switching element is electrically connected to the light emitting element. The differential amplifier circuit includes an output terminal, a first input terminal, a second input terminal, and an adjustment part. The output terminal is electrically connected to the current-controlling switching element. The first input terminal receives a reference signal as a reference for radiating light with a desired intensity from the light emitting element. The second input terminal receives a detection signal corresponding to a detection result of a current flowing in the light emitting element. The differential amplifier circuit controls the current flowing in the light emitting element and the current-controlling switching element based on a voltage of the first input terminal and a voltage of the second input terminal. The adjustment part is capable of adjusting an overshoot amount of a rising edge of the current flowing in the light emitting element. The control part controls operation of the driver circuit.

DETAILED DESCRIPTION

Embodiments will now be described with reference to the drawings. In the drawings, the same elements are marked with the same reference numerals.

Figure 1:
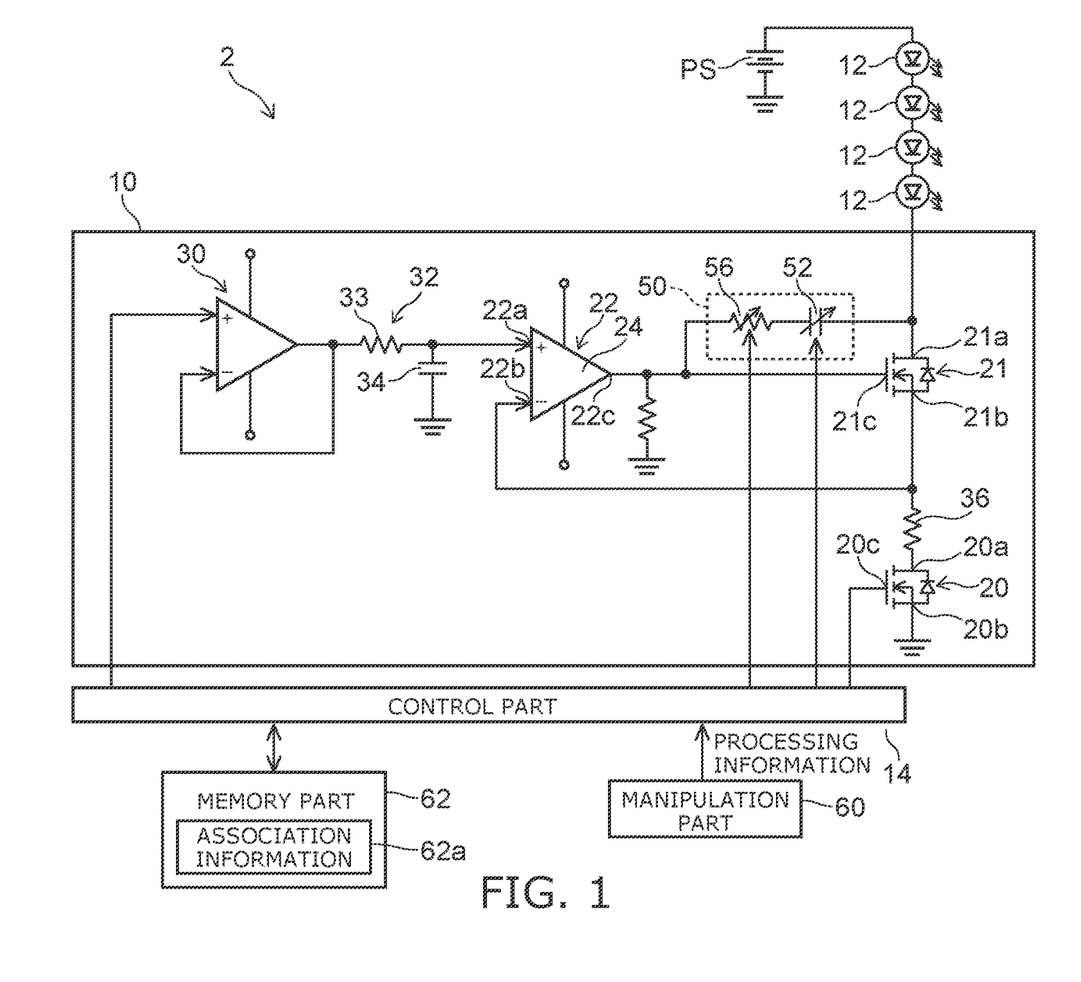
FIG. 1 is a block diagram schematically showing a driver circuit and a processing device according to an embodiment.

FIG. 1 is a block diagram schematically showing a driver circuit and a processing device according to an embodiment.

As shown in FIG. 1, the processing device 2 includes a driver circuit 10 and at least one light emitting element 12. The processing device 2 includes, for example, a plurality of light emitting elements 12 connected in series. For convenience, FIG. 1 shows four light emitting elements 12 connected in series. The number of light emitting elements 12 is not required to be four, but may be appropriately determined. The number of light emitting elements 12 may be one. The light emitting element 12 is, for example, a laser diode. However, the light emitting element 12 is not required to be a laser diode, but may be other light emitting elements such as a light emitting diode.

The light emitting element 12 is electrically connected to the driver circuit 10. The light emitting element 12 is electrically connected to a DC power supply PS. The DC power supply PS supplies DC supply direct-current electricity to the light emitting element 12. The light emitting element 12 radiates light in response to supply of DC power from the DC power supply PS. The term "electrically connected" may refer to the state in which two members are directly connected through, for example, an interconnect, or the state in which two members are indirectly connected through, for example, another conductive member.

The driver circuit 10 drives the light emitting element 12. In other words, the driver circuit 10 drives supply of DC power from the DC power supply PS to the light emitting element 12. The driver circuit 10 performs switching between radiation of light and its stoppage from the light emitting element 12, and adjusts the intensity of light radiated from the light emitting element 12. Thus, the processing device 2 performs a predetermined processing on an object by driving the light emitting element 12 with the driver circuit 10 and radiating light of a predetermined pattern from the light emitting element 12 through an optical system.

More specifically, the processing device 2 is, for example, a light exposure device or a machining device. In the case of a light exposure device, the object to be processed by the processing device 2 is, for example, a semiconductor wafer. The processing device 2 performs light exposure of a predetermined pattern on a resist applied onto the wafer surface with light radiated from the light emitting element 12 through an optical system. In the case of a machining device, the object to be processed by the processing device 2 is, for example, a metal plate. The processing device 2 performs various machining operations such as cutting and boring on the object with light radiated from the light emitting element 12 through an optical system.

The processing device 2 further includes a control part 14. The control part 14 controls the operation of the driver circuit 10. The driver circuit 10 drives the light emitting element 12 based on the control of the control part 14. For instance, the driver circuit 10 may be operated based on a control signal externally inputted through, for example, a network.

The driver circuit 10 includes a switching element 20, a current-controlling switching element 21, and a differential amplifier circuit 22. The current-controlling switching element 21 is electrically connected to the light emitting element 12. The current-controlling switching element 21 is, for example, connected in series to the light emitting element 12. The light emitting element 12 is provided between the DC power supply PS and the current-controlling switching element 21. For instance, the light emitting element 12 is a laser diode. In this case, the anode of one of the light emitting elements 12 is electrically connected to the DC power supply PS. The cathode of one of the light emitting elements 12 is electrically connected to the current-controlling switching element 21.

The switching element 20 is connected in series to the current-controlling switching element 21. The switching element 20 is provided, for example, between the current-controlling switching element 21 and the ground (common potential). Thus, a current flows in the light emitting element 12 by turning on the switching elements 20, 21. This causes light to be radiated from the light emitting element 12. On the other hand, supply of the current to the light emitting element 12 is stopped by turning off at least one of the switching elements 20, 21. This stops radiation of light from the light emitting element 12.

The switching elements 20, 21 are based on, for example, a bipolar transistor or FET. However, the switching elements 20, 21 are not required to be those, but may appropriately be selected from ones capable of switching between supply and its stoppage of the current to the light emitting element 12.

The current-controlling switching element 21 includes a first main terminal 21a, a second main terminal 21b, and a control terminal 21c. The first main terminal 21a is electrically connected to the light emitting element 12. The control terminal 21c controls the current flowing between the first main terminal 21a and the second main terminal 21b. For instance, the current-controlling switching element 21 is an FET. In this case, the first main terminal 21a is a drain, the second main terminal 21b is a source, and the control terminal 21c is a gate. Likewise, the switching element 20 includes a first main terminal 20a, a second main terminal 20b, and a control terminal 20c.

The current-controlling switching element 21 adjusts the magnitude of the current flowing between the first main terminal 21a and the second main terminal 21b in response to the voltage applied to the control terminal 21c. That is, the driver circuit 10 adjusts the magnitude of the current flowing in the light emitting element 12 by adjusting the voltage of the control terminal 21c of the current-controlling switching element 21. In other words, the driver circuit 10 adjusts the intensity of light radiated from the light emitting element 12 by adjusting the voltage of the control terminal 21c of the current-controlling switching element 21. The driver circuit 10 adjusts the voltage of the control terminal 21c so that, for example, a substantially constant current flows in the light emitting element 12. The driver circuit 10 is, for example, a constant current circuit.

The differential amplifier circuit 22 includes a first input terminal 22a, a second input terminal 22b, and an output terminal 22c. The output terminal 22c is electrically connected to the control terminal 21c of the current-controlling switching element 21. The first input terminal 22a receives a reference signal as a reference for radiating light with a desired intensity from the light emitting element 12. The second input terminal 22b receives a detection signal corresponding to the detection result of the current flowing in the light emitting element 12. In other words, the detection signal is a feedback signal for feeding back the detection result of the current flowing in the light emitting element 12, to the differential amplifier circuit 22. A resistor and a capacitor may be placed between the output terminal 22c and the first main terminal 21a of the current-controlling switching element 21.

The differential amplifier circuit 22 controls the current flowing in the light emitting element 12 and the current-controlling switching element 21 based on the voltage of the first input terminal 22a and the voltage of the second input terminal 22b. The differential amplifier circuit 22 applies a voltage in accordance with the difference between the reference signal and the detection signal to the control terminal 21c of the current-controlling switching element 21. Thus, the differential amplifier circuit 22 causes a substantially constant current corresponding to the reference signal to flow in the light emitting element 12.

The detection signal is set so as to have, for example, the same value as the reference signal when a desired current corresponding to the reference signal flows in the light emitting element 12. The differential amplifier circuit 22 causes a substantially constant current to flow in the light emitting element 12 by applying a voltage from the output terminal 22c to the control terminal 21c.

When the current flowing in the light emitting element 12 is larger than the desired current corresponding to the reference signal, the detection signal becomes larger, and its difference from the reference signal becomes smaller than a predetermined amount. Thus, the voltage applied to the control terminal 21c becomes smaller. Accordingly, the current flowing in the light emitting element 12 is controlled to decrease. Conversely, when the current flowing in the light emitting element 12 is smaller than the desired current corresponding to the reference signal, the detection signal becomes smaller, and its difference from the reference signal becomes larger than a predetermined amount. Thus, the voltage applied to the control terminal 21c becomes larger. Accordingly, the current flowing in the light emitting element 12 is controlled to increase. Thus, the current flowing in the light emitting element 12 can be closer to the value corresponding to the reference signal and controlled to be a substantially constant current.

The differential amplifier circuit 22 includes, for example, an operational amplifier 24. The first input terminal 22a is, for example, a non-inverting input terminal of the operational amplifier 24. The second input terminal 22b is, for example, an inverting input terminal of the operational amplifier 24. The differential amplifier circuit 22 is not required to a configuration including an operational amplifier 24, but may be configured to have the same function by combining, for example, a plurality of transistors.

The first input terminal 22a is electrically connected to the control part 14. The reference signal is inputted from the control part 14. The control part 14 controls the reference signal to be inputted into the first input terminal 22a so that light of an appropriate intensity is radiated from the light emitting element 12 in accordance with, for example, the kind of the object or the kind of processing performed on the object. The control part 14 can decrease the voltage applied to the control terminal 21c by decreasing the reference signal (e.g., to 0 V). Thus, the control part 14 can turn off the current-controlling switching element 21. That is, the light emitting element 12 can be maintained in the unlit state.

The driver circuit 10 includes, for example, a voltage follower 30 and a low-pass filter 32. The voltage follower 30 is provided between the control part 14 and the first input terminal 22a. The voltage follower 30 functions as, for example, a buffer for reducing variation of the signal outputted from the control part 14. The voltage follower 30 is configured of, for example, an operational amplifier in which the output terminal and the inverting input terminal are short-circuited.

The low-pass filter 32 is provided between the voltage follower 30 and the first input terminal 22a. The low-pass filter 32 includes, for example, a resistor element 33 and a capacitor 34. The resistor element 33 is connected between the voltage follower 30 and the first input terminal 22a. The capacitor 34 is connected between the ground (common potential) and the signal line connecting the first input terminal 22a and the resistor element 33. The low-pass filter 32 reduces, for example, high-frequency components contained in the signal outputted from the control part 14 (voltage follower 30).

The voltage follower 30 and the low-pass filter 32 thus provided enables a more appropriate reference signal to be inputted to the first input terminal 22a. The voltage follower 30 and the low-pass filter 32 are provided as necessary, and can be omitted.

The driver circuit 10 includes a resistor element 36. One end of the resistor element 36 is electrically connected to the second main terminal 21b of the current-controlling switching element 21. The other end of the resistor element 36 is electrically connected to the first main terminal 20a of the switching element 20. Thus, a voltage corresponding to the current flowing in the light emitting element 12 is generated across the resistor element 36 and the switching element 20. In other words, the resistor element 36 is a resistor for detecting the current flowing in the light emitting element 12.

One end of the resistor element 36 is electrically connected to the second input terminal 22b and the second main terminal 21b of the current-controlling switching element 21. Thus, the voltage generated across the resistor element 36 and the switching element 20 is inputted to the second input terminal 22b as a detection signal. However, the method for inputting the detection signal to the second input terminal 22b is not required to be those, but may be appropriately determined.

The second main terminal 20b of the switching element 20 is electrically connected to the ground (common potential). The control terminal 20c of the switching element 20 is electrically connected to the control part 14. The control part 14 controls a pulse signal periodically repeating on/off to be inputted into the control terminal 20c of the switching element 20.

When the pulse signal is on (high), the voltage value of the pulse signal is sufficiently higher than the threshold voltage value of the switching element 20. Thus, when the pulse signal is on, the current flowing in the light emitting element 12 is controlled based on the reference signal and the detection signal as described above.

On the other hand, when the pulse signal is off (low), the voltage value of the pulse signal is lower than the threshold voltage value of the switching element 20. That is, when the pulse signal is off, radiation of light from the light emitting element 12 is stopped.

Thus, the control part 14 controls a reference signal to be inputted into the first input terminal 22a of the differential amplifier circuit 22, and a pulse signal to be inputted into the control terminal 20c of the switching element 20. Accordingly, the control part 14 causes pulse oscillation in the light emitting element 12.

The control part 14 varies the duty cycle of the pulse signal inputted to the control terminal 20c of the switching element 20 in accordance with, for example, the kind of the object or the kind of processing performed on the object. This facilitates adjusting, for example, energy applied to the object. The oscillation of the light emitting element 12 is not required to be pulse oscillation, but may be continuous oscillation. The switching element 20 and the input of the pulse signal from the control part 14 to the control terminal 20c of the switching element 20 can be omitted in the case of operation only in continuous oscillation.

In this example, the control part 14 is illustrated as a signal source for inputting a pulse signal for causing pulse oscillation in the light emitting element 12 to the control terminal 20c of the switching element 20. The signal source is not required to be the control part 14, but may be an appropriately selected signal source capable of inputting a pulse signal to the control terminal 20c of the switching element 20. For instance, a dedicated oscillation circuit may be used as a signal source.

The driver circuit 10 further includes an adjustment part 50 for adjusting the overshoot amount of the rising edge of the current flowing in the light emitting element 12. The adjustment part 50 includes, for example, a variable capacitor 52 and a variable resistor 56.

The variable capacitor 52 and the variable resistor 56 are connected in series. The variable capacitor 52 and the variable resistor 56 are provided between the output terminal 22c of the differential amplifier circuit 22 and the first main terminal 21a of the current-controlling switching element 21. One end of the variable capacitor 52 is electrically connected to the variable resistor 56. The other end of the variable capacitor 52 is electrically connected to the first main terminal 21a of the current-controlling switching element 21.

When the amount of capacitance of the variable capacitor 52 is smaller, the rising edge of the current flowing in the light emitting element 12 is steeper, and overshoot is more likely to occur. That is, in the adjustment part 50, decreasing the amount of capacitance of the variable capacitor 52 can increase the overshoot amount of the rising edge of the current flowing in the light emitting element 12. Also, increasing the amount of capacitance of the variable capacitor 52 can decrease the overshoot amount of the rising edge of the current flowing in the light emitting element 12 can be decreased by.

The variable resistor 56 is provided between the output terminal 22c of the differential amplifier circuit 22 and the variable capacitor 52. The variable resistor 56 adjusts, for example, the voltage applied to the control terminal 21c.

When the resistance value of the variable resistor 56 is larger, overshoot is more likely to occur. Thus, in the adjustment part 50, increasing the resistance value of the variable resistor 56 can increase the overshoot amount of the rising edge of the current flowing in the light emitting element 12. Also, decreasing the resistance value of the variable resistor 56 can decrease the overshoot amount of the rising edge of the current flowing in the light emitting element 12.

The variable capacitor 52 and the variable resistor 56 are electrically connected to the control part 14. The control part 14 adjusts the overshoot amount of the rising edge of the current flowing in the light emitting element 12 by varying at least one of the capacitance value of the variable capacitor 52 and the resistance value of the variable resistor 56. That is, the control part 14 controls the adjustment of the overshoot amount by the adjustment part 50.

The variable capacitor 52 is based on, for example, a digital programmable capacitor. Thus, the capacitance value of the variable capacitor 52 can be varied by control of the control part 14. The variable resistor 56 is based on, for example, a digital potentiometer. Thus, the resistance value of the variable resistor 56 can be varied by control of the control part 14.

The control part 14 is electrically connected to, for example, a manipulation part 60 and a memory part 62. The manipulation part 60 can be an appropriately selected input device such as a keyboard, mouse, and touch panel. The manipulation part 60 is manipulated by, for example, an operator, and controls various manipulated instructions in accordance with the received manipulation to be input into the control part 14. The control part 14 controls the adjustment of the overshoot amount by the adjustment part 50 in accordance with, for example, the manipulated instruction inputted from the manipulation part 60. That is, the control part 14 varies at least one of the capacitance value of the variable capacitor 52 and the resistance value of the variable resistor 56 in accordance with the manipulated instruction inputted from the manipulation part 60.

The memory part 62 stores association information 62a. The association information 62a stores, for example, processing information related to the processing of the object in association with the suitable value of the overshoot amount for the processing. The processing information includes, for example, information indicating the kind of the object and information of processing performed on the object. The information indicating the kind of the object includes, for example, the material, size, and thickness of the object. The information of processing performed on the object includes, for example, information of the kind of processing such as cutting and boring, and information of the pattern of light radiation. The information included in the processing information is not required to be those, but may be information appropriately determined and necessary for processing the object.

The control part 14 receives processing information as one of the manipulated instructions from the manipulation part 60. When processing on the object, the operator of the processing device 2 manipulates the manipulation part 60 and controls processing information to be inputted into the control part 14. In response to receipt of the processing information, the control part 14 refers to the association information 62a stored in the memory part 62 and retrieves the suitable value of the overshoot amount corresponding to the inputted processing information from the association information 62a. Then, the control part 14 controls the adjustment of the overshoot amount by the adjustment part 50 in accordance with the retrieved suitable value. Thus, the adjustment by the adjustment part 50 can be automatically performed so as to achieve a suitable overshoot amount in accordance with, for example, the kind of the object and the content of processing.

Thus, the control part 14 enables the adjustment of the overshoot amount by the adjustment part 50 to be manually configured by operating the manipulation part 60. Furthermore, the control part 14 enables the adjustment of the overshoot amount by the adjustment part 50 to be automatically configured based on the processing information inputted from the manipulation part 60 and the association information 62a stored in the memory part 62.

The adjustment of the adjustment part 50 may be configured only manually, or may be configured only automatically. In the case of configuring the adjustment part 50 only manually, the memory part 62 can be omitted. In the case of configuring the adjustment part 50 only manually, the manipulation part 60 is not required to be electrically connected to the control part 14. The manipulation part 60 may be, for example, a dial for directly varying, for example, the capacitance value of the variable capacitor 52 and the resistance value of the variable resistor 56. That is, the manipulation part 60 may be provided in the adjustment part 50.

The processing information may be inputted from another device through, for example, a network. In this case, the part 60 can be omitted. The memory part 62 is not required to be electrically connected to the control part 14. The memory part 62 may be, for example, incorporated in the control part 14.

Thus, in the processing device 2 and the driver circuit 10 according to this embodiment, the overshoot amount of the rising edge of the current flowing in the light emitting element 12 can be adjusted by the adjustment part 50. Accordingly, the current flowing in the light emitting element 12 can be controlled more appropriately. That is, the intensity of light radiated from the light emitting element 12 can be controlled more appropriately.

As a result of diligent examination, the inventor of the present application has found that the accuracy of processing, such as machining and light exposure, can be improved by adjusting the overshoot amount of the rising edge of the current flowing in the light emitting element 12 when an object is processed in the processing device 2.

For instance, a linear pattern may be formed on an object formed using a material having high heat capacity. In this case, it takes time from the start of light irradiation until the temperature of the object increases. Thus, the desired shape cannot be obtained in the portion where light irradiation is started. Accordingly, in this case, the overshoot amount is increased to increase the intensity of light at the time of starting irradiation. This can accelerate the temperature increase of the object and further improve the accuracy of processing.

Conversely, a linear pattern may be formed on an object formed using a material having low heat capacity. In this case, if the overshoot amount is excessively large, an excessively large amount of energy may be applied to the portion on which irradiation is started. Thus, the overshoot amount is decreased in this case.

Thus, the inventor of the present application has found that the necessary overshoot amount is different depending on the object. In the processing device 2 and the driver circuit 10 according to this embodiment, the overshoot amount can be adjusted by the adjustment part 50. That is, the overshoot amount can be adjusted in accordance with the object so as to achieve an overshoot amount appropriate to the object. Thus, the accuracy of processing can be improved also in the case of processing various objects.

Furthermore, for instance, the relationship between the object and the suitable overshoot amount is measured in advance, and stored in the memory part 62 as association information 62a. Thus, the adjustment of the adjustment part 50 can be automatically performed as described above. This can further improve the convenience of the processing device 2.

Figure 2:
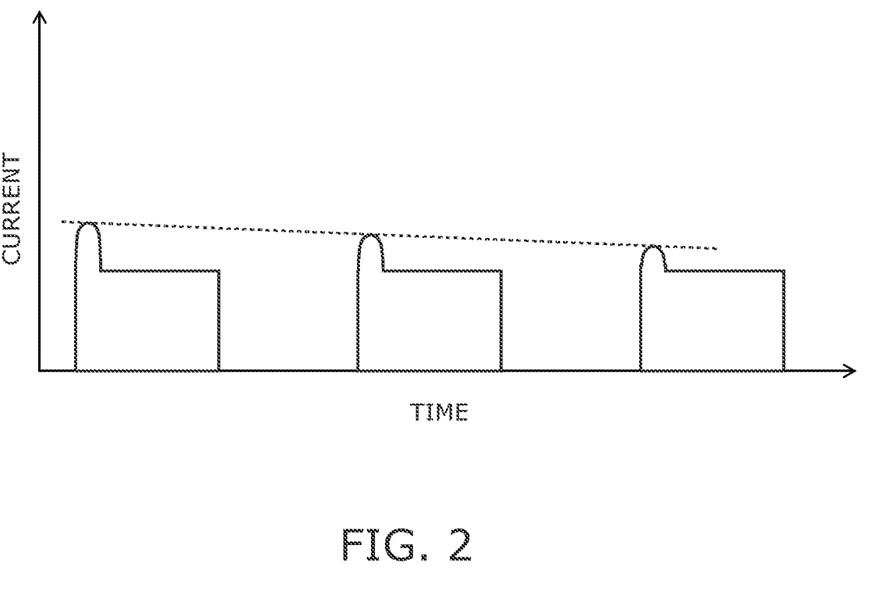
FIG. 2 is a graph schematically showing an example of the operation of the control part according to the embodiment.

FIG. 2 is a graph schematically showing an example of the operation of the control part according to the embodiment.

The horizontal axis of FIG. 2 represents time. The vertical axis represents the current flowing in the light emitting element 12.

As shown in FIG. 2, the control part 14 causes, for example, pulse oscillation in the light emitting element 12. When performing processing of one pattern on an object, the control part 14 controls the adjustment part 50 so that the overshoot amount gradually decreases for each pulse oscillation from the start of the pattern toward its end.

For instance, each time the light emitting element 12 is subjected to pulse oscillation, the temperature of the object may increase. That is, when light is radiated in the second or later pulses, the temperature of the object may be higher than when light is radiated in the first pulse. In this case, if a fixed overshoot amount is set to form a linear pattern on the object, the line width may gradually broaden with the temperature increase of the object.

Thus, in such a case, the overshoot amount is gradually decreased for each pulse oscillation. For instance, the overshoot amount is gradually decreased in accordance with the temperature increase of the object. Thus, for instance, a more appropriate amount of energy can be applied to the object in accordance with temperature variation of the object. This can attenuate, for example, the broadening of the line width and further improve the processing accuracy. When, for example, the temperature variation of the object is small, the overshoot amount does not need to be varied for each pulse oscillation. The overshoot amount can be set to be substantially constant.

Figure 3:
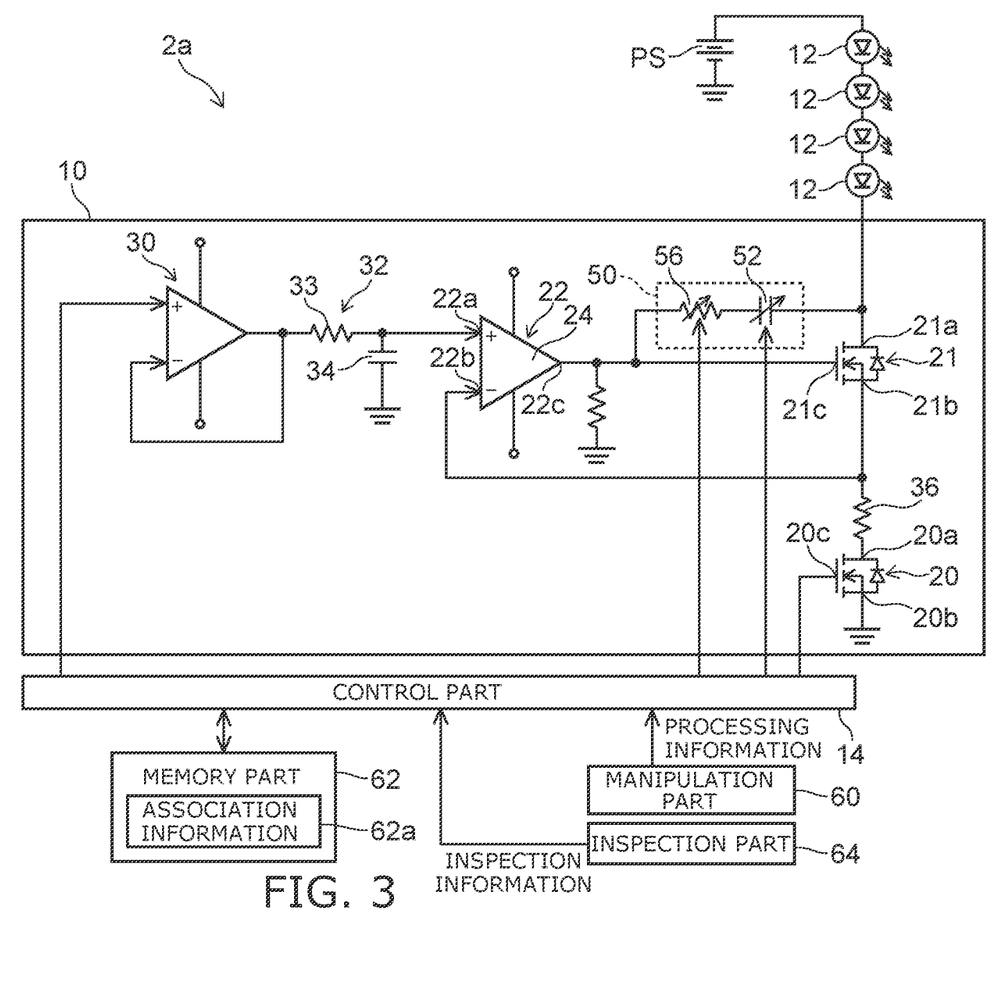
FIG. 3 is a block diagram schematically showing a variation of the driver circuit and the processing device according to the embodiment.

FIG. 3 is a block diagram schematically showing a variation of the driver circuit and the processing device according to the embodiment.

The elements substantially identical in function or configuration to those of the above embodiment are marked with the same reference numerals, and the detailed description thereof is omitted.

As shown in FIG. 3, the processing device 2a further includes an inspection part 64. The inspection part 64 inspects the processed object, and controls inspection information indicating the inspection result inputted into the control part 14. The inspection part 64 obtains, for example, image data of the processed object with a camera to inspect the processed object by image processing. Then, the inspection part 64 obtains, for example, information of the dimension of the processed portion as inspection information.

The control part 14 controls the adjustment of the overshoot amount by the adjustment part 50 based on the inspection information inputted from the inspection part 64. For instance, in forming a linear pattern, the line width of the portion on which irradiation is started may be narrow. In this case, the overshoot amount is increased. Thus, the inspection result can be fed back to the processing for the next object. This can further improve the processing accuracy.

The inspection information may be inputted to the control part 14 from, for example, another inspection device, or may be manually inputted by, for example, an operator, through the manipulation part 60. In this case, the inspection part 64 can be omitted also in the case in which the adjustment part 50 is controlled in accordance with the inspection information.

In the above embodiments, the adjustment part 50 includes a variable capacitor 52 and a variable resistor 56. The overshoot amount can be adjusted by one of the capacitance value of the variable capacitor 52 and the resistance value of the variable resistor 56. However, the configuration of the adjustment part 50 is not required to be foregoing. For instance, the adjustment part 50 only needs to have the variable function in at least one of the capacitor and the resistor. The adjustment part 50 may include a variable capacitor 52 and a resistor, or may include a capacitor and a variable resistor 56. The configuration of the adjustment part 50 may be appropriately determined so long as the configuration capable of adjusting the overshoot amount of the rising edge of the current flowing in the light emitting element 12.

While certain embodiments have been described, these embodiments have been presented by way of example only, and are not intended to limit the scope of the invention. Indeed, the novel embodiments described herein may be embodied in a variety of other forms. Furthermore, various omissions, substitutions and changes in the form of the embodiments described herein may be made without departing from the spirit of the invention. The accompanying claims and their equivalents are intended to cover such forms or modifications as would fall within the scope and spirit of the invention.

What is claimed is:

1. A processing device comprising:
a DC power supply;
a light emitting element electrically connected to the DC power supply, the light emitting element being configured to radiate light in response to supply of DC power from the DC power supply; and
a current-controlling switching element electrically connected in series to the light emitting element, wherein the light emitting element is between the DC power supply and the current-controlling switching element;
a differential amplifier circuit comprising:
an output terminal electrically connected to the current-controlling switching element,
a first input terminal configured to receive a reference signal as a reference for radiating light with a desired intensity from the light emitting element, and
a second input terminal configured to receive a detection signal corresponding to a detection result of a current flowing in the light emitting element,
wherein the differential amplifier circuit is configured to control the current flowing in the light emitting element and the current-controlling switching element based on a voltage of the first input terminal and a voltage of the second input terminal; and
an adjustment part configured to adjust an overshoot amount of a rising edge of the current flowing in the light emitting element.

2. A driver circuit comprising:
a current-controlling switching element comprising a main terminal electrically connected to a light emitting element;
a differential amplifier circuit comprising:

an output terminal electrically connected to the current-controlling switching element,
a first input terminal configured to receive a reference signal as a reference for radiating light with a desired intensity from the light emitting element, and
a second input terminal configured to receive a detection signal corresponding to a detection result of a current flowing in the light emitting element,
wherein the differential amplifier circuit is configured to control the current flowing in the light emitting element and the current-controlling switching element based on a voltage of the first input terminal and a voltage of the second input terminal; and
a variable capacitor between the output terminal and the main terminal of the current-controlling switching element, the variable capacitor configured to adjust an overshoot amount of a rising edge of the current flowing in the light emitting element.

3. A driver circuit comprising:
a current-controlling switching element comprising a main terminal electrically connected to a light emitting element;
a differential amplifier circuit comprising:
an output terminal electrically connected to the current-controlling switching element,
a first input terminal configured to receive a reference signal as a reference for radiating light with a desired intensity from the light emitting element, and
a second input terminal configured to receive a detection signal corresponding to a detection result of a current flowing in the light emitting element,
wherein the differential amplifier circuit is configured to control the current flowing in the light emitting element and the current-controlling switching element based on a voltage of the first input terminal and a voltage of the second input terminal; and
a variable resistor between the output terminal and the main terminal of the current-controlling switching element, the variable resistor configured to adjust an overshoot amount of a rising edge of the current flowing in the light emitting element.

4. A processing device comprising:
a light emitting element;
a driver circuit driving the light emitting element and comprising:
a current-controlling switching element electrically connected to the light emitting element;
a differential amplifier circuit comprising:
an output terminal electrically connected to the current-controlling switching element,
a first input terminal configured to receive a reference signal as a reference for radiating light with a desired intensity from the light emitting element, and
a second input terminal configured to receive a detection signal corresponding to a detection result of a current flowing in the light emitting element,
wherein the differential amplifier circuit is configured to control the current flowing in the light emitting element and the current-controlling switching element based on a voltage of the first input terminal and a voltage of the second input terminal;
an adjustment part configured to adjust an overshoot amount of a rising edge of the current flowing in the light emitting element; and
a control part configured to:
control operation of the driver circuit;
cause pulse oscillation in the light emitting element; and
control the adjustment part such that, when performing processing of a pattern on an object, the overshoot amount gradually decreases for each of the pulse oscillations from a start of the pattern to an end of the pattern.

5. The device according to claim 4, wherein the control part is configured to control adjustment of the overshoot amount by the adjustment part based on association information in which processing information related to processing of an object is stored in association with a suitable value of the overshoot amount for the processing.

6. The device according to claim 4, wherein the control part is configured to control adjustment of the overshoot amount by the adjustment part based on inspection information indicating an inspection result of a processed object.

7. The device according to claim 4, further comprising:
a manipulation part configured to be manipulated by an operator and to provide instructions to the control part in accordance with the manipulation; wherein:
the control part is configured to control the adjustment of the overshoot amount by the adjustment part in accordance with the instructions received from the manipulation part.

8. The device according to claim 1, wherein:
the current-controlling switching element comprises a main terminal electrically connected to the light emitting element; and
the adjustment part is between the output terminal and the main terminal of the current-controlling switching element.

9. The device according to claim 1, further comprising: p1 a switching element connected in series to the current-controlling switching element; wherein:
the current-controlling switching element is configured to adjust a magnitude of the current flowing in the light emitting element; and
the switching element is configured to receive a pulse signal and cause pulse oscillation in the light emitting element based on the pulse signal.

10. The device according to claim 1, wherein:
the first input terminal is electrically connected to a control part,
the differential amplifier circuit is configured to receive the reference signal from the control part.

11. The device according to claim 10, further comprising:
a voltage follower between the control part and the first input terminal, the voltage follower being configured to reduce variation of the reference signal output from the control part.

12. The device according to claim 11, further comprising:
a low-pass filter between the voltage follower and the first input terminal, the low-pass filter being configured to reduce high-frequency components contained in the reference signal output from the control part.

* * * * *

UNITED STATES PATENT AND TRADEMARK OFFICE
CERTIFICATE OF CORRECTION

PATENT NO. : 11,522,337 B2
APPLICATION NO. : 16/391182
DATED : December 6, 2022
INVENTOR(S) : Hideki Kondo It is certified that error appears in the above-identified patent and that said Letters Patent is hereby corrected as shown below:

In the Claims

Claim 9, Column 12, Line 40:
Please delete:
"The device according to claim 1, further comprising: p1"
Please replace with:
"The device according to claim 1, further comprising:"

Signed and Sealed this
Fourteenth Day of March, 2023

Katherine Kelly Vidal
*Director of the United States Patent and Trademark Office*